United States Patent
Fuller et al.

(10) Patent No.: US 8,871,107 B2
(45) Date of Patent: Oct. 28, 2014

(54) SUBTRACTIVE PLASMA ETCHING OF A BLANKET LAYER OF METAL OR METAL ALLOY

(71) Applicants: International Business Machines Corporation, Armonk, NY (US); Applied Materials, Inc., Santa Clara, CA (US)

(72) Inventors: Nicholas C. M. Fuller, North Hills, NY (US); Eric A. Joseph, White Plains, NY (US); Hiroyuki Miyazoe, White Plains, NY (US); Mark Hoinkis, Fishkill, NY (US); Chun Yan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/838,763

(22) Filed: Mar. 15, 2013

(65) Prior Publication Data

US 2014/0273437 A1 Sep. 18, 2014

(51) Int. Cl.
| | |
|---|---|
| C03C 15/00 | (2006.01) |
| C03C 25/68 | (2006.01) |
| C23F 1/00 | (2006.01) |
| C23F 3/00 | (2006.01) |
| H01L 21/44 | (2006.01) |
| H01L 21/302 | (2006.01) |
| H01L 21/461 | (2006.01) |
| H01L 21/768 | (2006.01) |

(52) U.S. Cl.
CPC .............................. H01L 21/76885 (2013.01)
USPC ................. 216/78; 216/67; 216/75; 438/658; 438/669; 438/710; 438/714; 438/717

(58) Field of Classification Search
USPC ......... 438/653, 658, 710, 712, 669, 717, 719; 216/67, 75, 78
See application file for complete search history.

(56) References Cited

U.S. PATENT DOCUMENTS

| | | | |
|---|---|---|---|
| 4,557,796 A | 12/1985 | Druschke et al. | |
| 4,838,994 A | 6/1989 | Gulde et al. | |

(Continued)

FOREIGN PATENT DOCUMENTS

| | | |
|---|---|---|
| JP | 6204184 | 7/1994 |
| JP | 6204185 | 7/1994 |

(Continued)

OTHER PUBLICATIONS

Wu, F. et al., "Temperature Effects and Optical Emission Spectroscopy Studies of Hydrogen-Based Plasma Etching of Copper", Journal of the Electrochemical Society, Feb. 2012, 159 (2) H121-H124.

(Continued)

*Primary Examiner* — Karen Kusumakar
(74) *Attorney, Agent, or Firm* — Scully, Scott, Murphy & Presser, P.C.; Louis J. Percello, Esq.

(57) ABSTRACT

A method of forming at least one metal or metal alloy feature in an integrated circuit is provided. In one embodiment, the method includes providing a material stack including at least an etch mask located on a blanker layer of metal or metal alloy. Exposed portions of the blanket layer of metal or metal alloy that are not protected by the etch mask are removed utilizing an etch comprising a plasma that forms a polymeric compound and/or complex which protects a portion of the blanket layer of metal or metal alloy located directly beneath the etch mask during the etch.

24 Claims, 4 Drawing Sheets

(56) References Cited

U.S. PATENT DOCUMENTS

| | | | |
|---|---|---|---|
| 5,318,662 | A | 6/1994 | Douglas |
| 5,354,416 | A | 10/1994 | Okudaira et al. |
| 5,431,774 | A | 7/1995 | Douglas |
| 5,578,166 | A | 11/1996 | Hirota |
| 6,010,603 | A | 1/2000 | Ye et al. |
| 6,355,979 | B2 | 3/2002 | Tesauro et al. |
| 6,498,109 | B2 | 12/2002 | Iyer |
| 6,534,416 | B1 | 3/2003 | Ye et al. |
| 6,797,640 | B2 | 9/2004 | Tesauro et al. |
| 2004/0209468 | A1* | 10/2004 | Kumar et al. ............ 438/689 |
| 2008/0064220 | A1* | 3/2008 | Fernandez et al. ......... 438/706 |
| 2010/0018553 | A1* | 1/2010 | Mikhaylichenko et al. .... 134/18 |
| 2010/0041236 | A1* | 2/2010 | Lin et al. ............... 438/704 |

FOREIGN PATENT DOCUMENTS

| | | |
|---|---|---|
| JP | 6204186 A | 7/1994 |
| JP | 729878 | 1/1995 |

OTHER PUBLICATIONS

Wu, F., et al., "Patterning of Cu Films by a Two-Step Plasma Etching Process at Low Temperature", Journal of the Electrochemical Society, Aug. 2012, 157, 4, H474-H478.

Choi, K.-S., et al., "Low Temperature Copper Etching Using an Inductively Coupled Plasma with Ultraviolet Light Irradiation", J. Electrochem. Soc., Mar. 1998, vol. 145, No. 3.

Wu, F., et al., "Mechanistic considerations of low temperature hydrogen-based plasma etching of Cu", J. Vac. Sci. Technol., Jan./Feb. 2011, B 29(1).

Wu, F., et al., "Low-Temperature Etching of Cu by Hydrogen-Based Plasmas", Applied Materials & Interfaces, Published on Web Jul. 16, 2010, vol. 2, No. 8, pp. 2175-2179.

U.S. Appl. No. 13/671,186, entitled "Sputter and Surface Modification Etch Processing for Metal Patterning in Integrated Circuits", filed Nov. 7, 2012, First Named Inventor: Cyril Cabral, Jr.

U.S. Appl. No. 13/671,166, entitled "Sputter and Surface Modification Etch Processing for Metal Patterning in Integrated Circuits", filed Nov. 7, 2012, First Named Inventor: Cyril Cabral, Jr.

* cited by examiner

SUBTRACTIVE PLASMA ETCHING OF A BLANKET LAYER OF METAL OR METAL ALLOY

BACKGROUND

The present disclosure relates to integrated circuits (ICs) and methods of forming the same. More particularly, the present disclosure relates to a method of forming a metal-containing interconnect structure using a subtractive plasma etch process.

Integrated circuits (ICs) commonly use copper interconnects (or "lines") to connect semiconductor devices such as, for example, transistors, on the ICs. These interconnects are typically formed using an additive damascene process in which an interconnect dielectric material is patterned to include at least one opening therein. Copper is subsequently deposited within the opening and thereafter any copper that is located outside the at least one opening can be removed via a planarization process. Successive layers of interconnect dielectric and copper can be formed using such an additive damascene process resulting in a multilayered copper interconnect structure.

Conventional damascene processing such as that described above is not always compatible with the trend toward smaller feature sizes in modern complementary metal oxide semiconductor (CMOS) technology. For instance, modern CMOS technology may require line widths of less than forty nanometers and aspect ratios (i.e., line height to line width) of approximately 2:1. Attempting conventional damascene processing within these parameters often results in poor liner/seed coverage on the walls of the openings formed into the interconnect dielectric material, and reentrant profiles. Consequently, the copper filling the at least one opening is subject to voids, defects, and poor adhesion to the liner material. Moreover, as the lines narrow in size, the resistivity of the copper is increased (due to, for example, the thickness of the liner relative to the copper, the small copper grain size, and copper grain boundary and surface scattering phenomena), resulting in decreased IC performance.

SUMMARY

A subtractive plasma etch is employed to etch a blanket layer of a metal or metal alloy. The subtractive plasma etch of the present disclosure employs a plasma which generates a polymeric compound and/or complex, such as, for example, a polymeric hydrocarbon containing compound and/or complex, on portions of the blanket layer of metal or metal alloy that are located directly beneath an etch mask.

In one aspect of the present disclosure, a method of forming at least one metal or metal alloy feature in an integrated circuit is provided. The method of the present disclosure includes providing a material stack including at least an etch mask located on a blanket layer of metal or metal alloy. Exposed portions of the blanket layer of metal or metal alloy that are not protected by the etch mask are removed utilizing an etch comprising a plasma. In accordance with the present disclosure and during the plasma etching process, the plasma forms a polymeric compound and/or complex which protects a portion of the blanket layer of metal or metal alloy located directly beneath the etch mask during the etch.

In another aspect of the present disclosure, another method of forming at least one metal or metal alloy feature in an integrated circuit is provided. This method includes providing a material stack on a surface of a substrate. The material stack comprises, from bottom to top, a blanket layer of dielectric material, a blanket layer of metal or metal alloy, a blanket layer of a first hard mask material, and a blanket layer of a second hard mask material. A patterned mask is then formed on an uppermost surface of the material stack. Next, a pattern from the patterned mask is transferred into the blanket layer of second hard mask material. After transferring the pattern, the patterned mask is removed. Next, the pattern from a remaining portion of the blanket layer of second hard mask material is transferred into the blanket layer of first hard mask material. After transferring the pattern, the remaining portion of the blanket layer of second hard mask material is removed. Next, exposed portions of the blanket layer of metal or metal alloy that are not protected by a remaining portion of the blanket layer of first hard mask material are removed utilizing an etch comprising a plasma. In accordance with the present disclosure, the plasma forms a polymeric compound and/or complex which protects a portion of the blanket layer of metal or metal alloy located directly beneath the remaining portion of the blanket layer of first hard mask material during the plasma etching process.

DETAILED DESCRIPTION

The present disclosure, which provides a method of forming a metal or metal alloy interconnect structure using a subtractive plasma etch process, will now be described in greater detail by referring to the following discussion and drawings that accompany the present application. It is noted that the drawings of the present application are provided for illustrative purposes only and, as such, the drawings are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

Reference is now made to FIGS. 1-11 which illustrate an embodiment of the present disclosure that can be employed in forming a metal or metal alloy feature of an interconnect structure. In the method of the present disclosure, a subtractive plasma etching process is employed to etch a blanket layer of metal, such as, for example, copper, or a metal alloy such as, for example, Cu—Al. The subtractive plasma etch of the present disclosure employs a plasma which forms a polymeric compound and/or complex on portions of the blanket layer of metal or metal alloy that are located directly beneath an etch mask.

Although the description and drawings that are provided herein below form a single conductive feature, the same basic processing steps can be used to form a plurality of conductive features within the same level of the interconnect structure.

Figure 1:
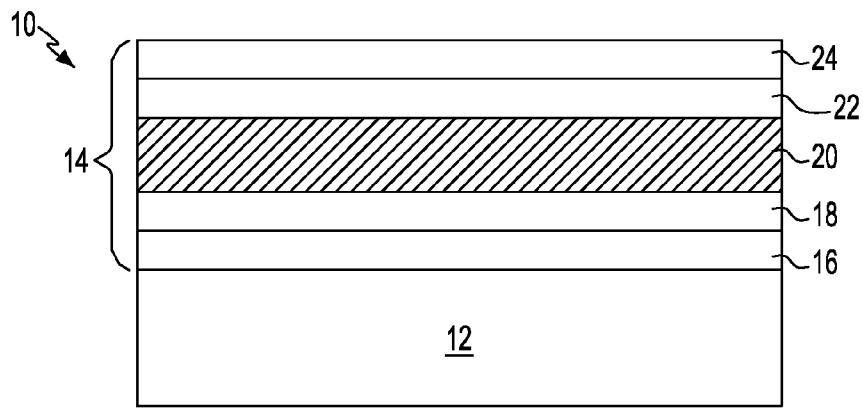
FIG. 1 is a pictorial representation (through a cross sectional view) of a structure including a material stack comprising, from bottom to top, a blanket layer of dielectric material, a blanket layer of a diffusion barrier material, a blanket layer of metal or metal alloy, a blanket layer of a first hard mask material, and a blanket layer of a second hard mask material, which is located on an upper surface of a substrate.

Referring first to FIG. 1, there is illustrated a structure 10 including a material stack 14 located on an upper surface of a substrate 12 that can be employed in one embodiment of the present disclosure. Other material stacks can also be used as along as the material stack includes at least one blanket layer of metal or metal alloy which can be patterned into a conductive feature using the subtractive plasma etching process of the present disclosure.

In one embodiment of the present disclosure, the substrate 12 may be composed of a semiconductor material. Examples of semiconductor materials that may be used as substrate 12 include, but are not limited to, Si, SiGe, SiGeC, SiC, Ge alloys GaAs, InAs, InP, carbon-containing materials such as, for example, carbon nanotubes and graphene, and other III/V or II/VI compound semiconductors. In one embodiment, the semiconductor material which can be employed as substrate 12 may be present in a bulk semiconductor substrate. In another embodiment, the semiconductor material which can be employed as substrate 12 may be a topmost layer of a multilayered semiconductor material stack. In yet another embodiment, the semiconductor material that can be employed as substrate 12 can be a topmost layer of a semiconductor-on-insulator substrate.

In some embodiments, the semiconductor material that can be employed as the substrate 12 can be single crystalline (i.e., a material in which the crystal lattice of the entire sample is continuous and unbroken to the edges of the sample, with no grain boundaries). In another embodiment, the semiconductor material that can be employed as the substrate 12 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the substrate 12 can be amorphous (i.e., a non-crystalline material that lacks the long-range order characteristic of a crystal). Typically, the semiconductor material that can be employed as substrate 12 is a single crystalline semiconductor material, such as, for example, single crystalline silicon.

The semiconductor material that can be employed as substrate 12 may be doped, undoped or contain doped and undoped regions therein. For clarity, the doped regions are not specifically shown in substrate 12. Each doped region within the semiconductor material may have the same, or they may have different conductivities and/or doping concentrations.

When the substrate 12 comprises a semiconductor material, the semiconductor material can be processed utilizing techniques well known to those skilled in the art to include one or more semiconductor devices such as, for example, transistors, capacitors, diodes, resistors, and BiCMOS devices. For clarity, the one or more semiconductor devices are not shown in the drawings of the present disclosure.

In some embodiments and when substrate 12 is comprised of a semiconductor material, the semiconductor material can be processed to include at least one isolation region therein. For clarity, the at least one isolation region is not shown in the drawings of the present disclosure. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region provides isolation between neighboring gate structure regions, typically required when the neighboring gates have opposite conductivities, i.e., nFETs and pFETs. As such, the at least one isolation region separates an nFET device region from a pFET device region.

In some embodiments, the substrate 12 may be comprised of an insulating material. In such embodiments, the insulating material can be an organic insulator, an inorganic insulator or a combination thereof including multilayers. In one example, substrate 12 may be comprised of glass.

In yet other embodiments, the substrate 12 may be comprised of a conductive material. In such an embodiment, the conductive material may include, for example, polySi, an elemental metal, alloys of elemental metals, a metal silicide, a metal nitride or combinations thereof including multilayers.

In yet further embodiments, substrate 12 may comprise a combination of an insulating material and a conductive material, wherein the conductive material is embedded therein. In such an embodiment, substrate 12 may represent a lower interconnect level of a multilayered interconnect structure.

As stated above, material stack 14 is located on a surface of substrate 12. In one embodiment of the present disclosure and as shown in FIG. 1, the material stack 14 comprises, from bottom to top, a blanket layer of dielectric material 16, a blanket layer of a diffusion barrier material 18, a blanket layer of metal or metal alloy 20, a blanket layer of a first hard mask material 22, and a blanket layer of a second hard mask material 24. In some embodiments of the present disclosure, the blanket layer of diffusion barrier material 18 can be omitted from the material stack 14. In such an instance, the material stack 14 would include, from bottom to top, a blanket layer of dielectric material 16, a blanket layer of metal or metal alloy 20, a blanket layer of a first hard mask material 22, and a blanket layer of a second hard mask material 24.

In some embodiments of the present disclosure, the blanket layer of dielectric material 16, can be omitted from the material stack 14. In such an instance, the material stack 14 would include, from bottom to top, an optional blanket layer of diffusion barrier material 18, a blanket layer of metal or metal alloy 20, a blanket layer of a first hard mask material 22, and a blanket layer of a second hard mask material 24.

When present, the blanket layer of dielectric material 16 is composed of an insulating (i.e., dielectric) material such as, for example, silicon dioxide, silicon nitride, silicon oxynitride, undoped silicate glass (USG), fluorosilicate glass (FSG), fluorinated tetraethyl orthosilicate (FTEOS), borophosphosilicate glass (BPSG), a dense or porous spin-on low-k dielectric layer, a dense or porous chemical vapor deposition (CVD) low-k dielectric layer or any combination thereof. The term "low-k" as used throughout the present disclosure denotes a dielectric material that has a dielectric constant of less than silicon dioxide.

The blanket layer of dielectric material 16 can be formed utilizing a conventional deposition process including, for example, chemical vapor deposition (CVD), plasma enhanced chemical vapor deposition (PECVD), evaporation and spin-on coating. The thickness of the blanket layer of dielectric material 16 that can be employed in the present disclosure may vary depending on the type of dielectric employed as well as the method that was employed in forming the same. In one embodiment, the blanket layer of dielectric material 16 can have a thickness from 80 nm to 500 nm. Other thicknesses that are greater or lesser than the range provided above can also be used for the blanket layer of dielectric material 16.

When present, the blanket layer of a diffusion barrier material 18 can be composed of a material that can serve as a barrier to prevent a conductive metal or metal alloy atom from diffusing there through. Examples of such barrier materials that can be employed as the blanket layer of diffusion barrier material 18 include, but are not limited to, cobalt (Co), iridium (Ir), platinum (Pt), palladium (Pd), tantalum (Ta), tantalum nitride (TaN), titanium (Ti), titanium nitride (TiN), manganese (Mn), manganese oxide ($MnO_x$), ruthenium (Ru), ruthenium nitride (RuN), a ruthenium-tantalum alloy (RuTa), ruthenium-tantalum nitride (RuTaN), tungsten (W), tungsten nitride (WN) or any multilayered stack thereof. In one embodiment, the blanket layer of diffusion barrier material 18 includes Ta, TaN, Ti and/or TaN.

The blanket layer of metal or metal alloy 20 which can be present in material stack 14 includes a conductive metal or metal alloy that can be used as an interconnect (i.e., conductive) feature. The conductive metal or metal alloy that is employed in the present disclosure does not form a volatile species with the underlying layers, particularly, the underlying blanket layer of diffusion barrier material 18. Also, it is noted that the blanket layer of metal or metal alloy 20 comprises a different material than the material used for the blanket layer of diffusion barrier material 18.

Illustrative examples of conductive metals that can be employed as the blanket layer of metal or metal alloy 20 include, but are not limited to, copper (Cu), gold (Au), nickel (Ni), cobalt (Co), aluminum (Al), or any multilayered stack thereof. Conductive metal alloys such as, for example, CuAl can also be employed as the blanket layer of metal or metal alloy 20. In one embodiment of the present disclosure, the blanket layer of metal or metal alloy 20 comprises Cu or CuAl.

The blanket layer of metal or metal alloy 20 can be formed utilizing a conventional deposition process including, for example, chemical vapor deposition (CVD), plasma enhanced chemical vapor deposition (PECVD), atomic layer deposition (ALD), physical vapor deposition, sputtering, chemical solution deposition and plating. The thickness of the blanket layer of metal or metal alloy 20 that can be employed in the present disclosure may vary depending on the type of conductive metal or metal alloy employed as well as the method that was employed in forming the same. In one embodiment, the blanket layer of metal or metal alloy 20 can have a thickness from 20 nm to 200 nm. Other thicknesses that are greater or lesser than the range provided above can also be used for the blanket layer of metal or metal alloy 20.

The blanket layer of first hard mask material 22 which can be present in material stack 14 includes a metal mask material. Illustrative examples of metal mask materials that can be employed in the present disclosure as the blanket layer of first hard mask material 22 include, but are not limited to, Ta, TaN, Ti, TiN, W, WN, niobium (Nb), vanadium (V) or a multilayered stack thereof. The blanket layer of first hard mask material 22 can be formed utilizing a conventional deposition process such as, for example, chemical vapor deposition (CVD), plasma enhanced chemical vapor deposition (PECVD), physical vapor deposition (PVD), sputtering and plating. The thickness of the blanket layer of first hard mask material 22 that can be employed in the present disclosure may vary depending on the type of metal or metal alloy material employed as well as the method that was employed in forming the same. In one embodiment, the blanket layer of first hard mask material 22 can have a thickness from 5 nm to 75 nm. Other thicknesses that are greater or lesser than the range provided above can also be used for the blanket layer of first hard mask material 22.

The blanket layer of second hard mask material 24 which can be present in material stack 14 includes a dielectric hard mask material. Illustrative examples of dielectric hard mask materials that can be employed in the present disclosure as the blanket layer of second hard mask material 24 include, but are not limited to, silicon dioxide, silicon nitride, silicon oxynitride or a multilayered stack thereof. In one embodiment, silicon dioxide is used as the dielectric hard mask material. The blanket layer of second hard mask material 24 can be formed utilizing a conventional deposition process such as, for example, chemical vapor deposition (CVD), plasma enhanced chemical vapor deposition (PECVD), evaporation, chemical solution deposition, physical vapor deposition (PVD) and atomic layer deposition (ALD). The thickness of the blanket layer of second hard mask material 24 that can be employed in the present disclosure may vary depending on the type of dielectric material employed as well as the method that was employed in forming the same. In one embodiment, the blanket layer of second hard mask material 24 can have a thickness from 5 nm to 80 nm. Other thicknesses that are greater or lesser than the range provided above can also be used for the blanket layer of second hard mask material 24.

Figure 2:
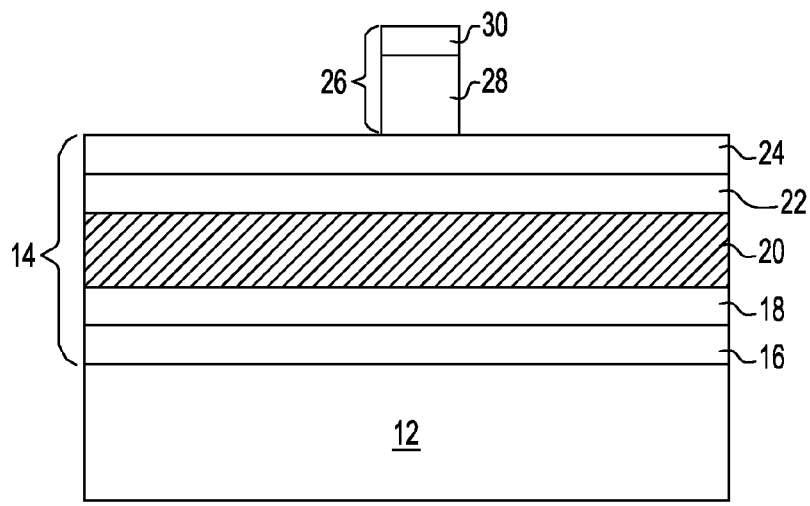
FIG. 2 is a pictorial representation (through a cross sectional view) of the structure of FIG. 1 after forming a patterned mask atop the blanket layer of second hard mask material.

Referring now to FIG. 2, there is illustrated the structure 10 of FIG. 1 after forming a patterned mask 26 atop a topmost surface of the material stack 14, i.e., on the surface of the blanket layer of second hard mask material 24. The patterned mask 26 that is employed in the present disclosure includes, for bottom to top, an organic underlayer 28 and a resist layer 30. As shown, the organic underlayer 28 has sidewalls that are vertically coincident to sidewalls of the resist layer 30.

The organic underlayer 28 that can be employed in the present disclosure includes near frictionless carbon (NFC) or any organic planarizing layer (OPL). In one embodiment in which the organic underlayer is an OPL, the OPL can include a non-photosensitive organic polymer including carbon, hydrogen, oxygen, and optionally fluorine. For example, the OPL can include hydrocarbons and/or hydrofluorocarbons. Additional possibilities for the OPL material include, but are not limited, to diamond like carbon (DLC), thermosetting polyarylene ethers, amorphous carbon materials, poly(stryenes), poly(esters), poly(methacrylates), poly(acrylates), poly(glycols), poly(amides), poly(norbornenes), or combinations thereof. The organic underlayer 28 can be formed as a blanket layer atop the blanket layer of second hard mask material 24 by utilizing a deposition process such as, for example, spin-coating, dip coating, brush coating, blade coating, and chemical solution deposition. The thickness of the organic underlayer 28 can be from 50 nm to 300 nm, although lesser and greater thicknesses can also be employed.

The resist layer 30 that can be employed in the present disclosure includes a photosensitive resist or an electron beam sensitive resist. In one embodiment of the present disclosure, the resist layer 30 is comprised of a siloxane such as, for example, a silsesquioxane. An example of a silsesquioxane that can be employed as resist layer 30 includes hydrogen silsesquioxane. In one embodiment, the resist layer 30 can be a negative tone-resist material. The resist layer 30 can be formed as a blanket layer atop the blanket layer of organic underlayer 28 by utilizing a deposition process such as, for example, spin-coating, dip coating, brush coating, blade coating, and chemical solution deposition. The thickness of the resist layer 30 can be from 50 nm to 150 nm, although lesser and greater thicknesses can also be employed.

The blanket layer of resist material is then lithographically patterned into a predetermined shape forming resist layer 30. In one embodiment of the present disclosure, lithographic patterning of the blanket layer of resist material may include optical lithography. In another embodiment of the present disclosure, lithographic patterning of the blanket layer of resist material may include electron beam lithography, such as, for example, direct write electron beam lithography. After lithographically patterning the blanket layer of resist material forming resist layer 30, the pattern within the resist layer 30 can be transferred to the blanket layer of organic underlayer material forming organic underlayer 28. In one embodiment of the present disclosure, the transfer of the pattern from resist layer 30 into the blanket layer of organic underlayer material includes an anisotropic etch.

Figure 3:
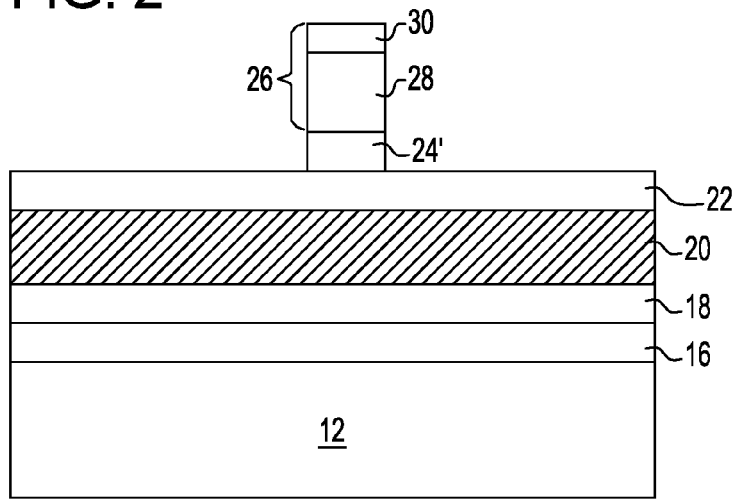
FIG. 3 is a pictorial representation (through a cross sectional view) of the structure of FIG. 2 after patterning the blanket layer of second hard mask material using the patterned mask as a first etch mask.

Referring to FIG. 3, there is illustrated the structure of FIG. 2 after patterning the blanket layer of second hard mask material 24 using the patterned mask 26 as a first etch mask. The remaining portion of the blanket layer of second hard mask material which is not removed during this step of the present disclosure is designated in the drawings as element 24'. The patterning of the blanket layer of second hard mask material 24 can include a dry etching process such as, for example, reactive ion etching, plasma etching, or ion beam etching. As shown, the remaining portion of the blanket layer of second hard mask material 24' has sidewalls that are vertically coincident to that of the patterned mask 26.

Figure 4:
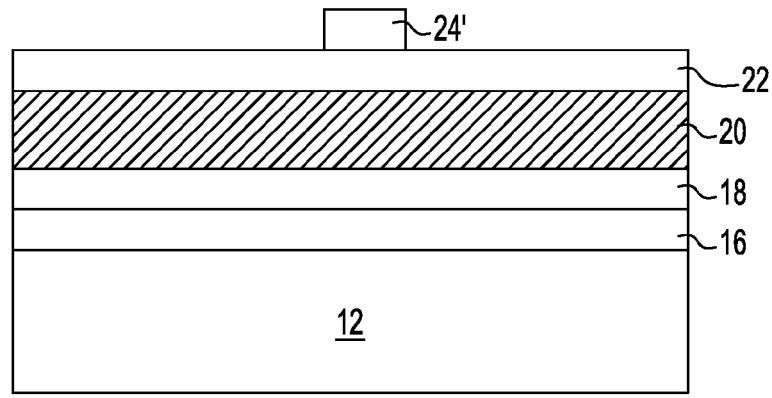
FIG. 4 is a pictorial representation (through a cross sectional view) of the structure of FIG. 3 after removing the patterned mask from the structure.

Referring now to FIG. 4, there is illustrated the structure of FIG. 3 after removing the patterned mask 26, i.e., the resist layer 30 and the organic underlayer 28, from the structure leaving the remaining portion of the blanket layer of second hard mask material 24' atop the blanket layer of first hard mask material 22. The removal of the patterned mask 26 can be achieved utilizing any conventional process that is capable of removing a resist material and an organic underlayer material from a structure. In one embodiment, the resist layer 30 can be removed by an ashing process, and the organic underlayer 28 can be removed by an ashing process.

Figure 5:
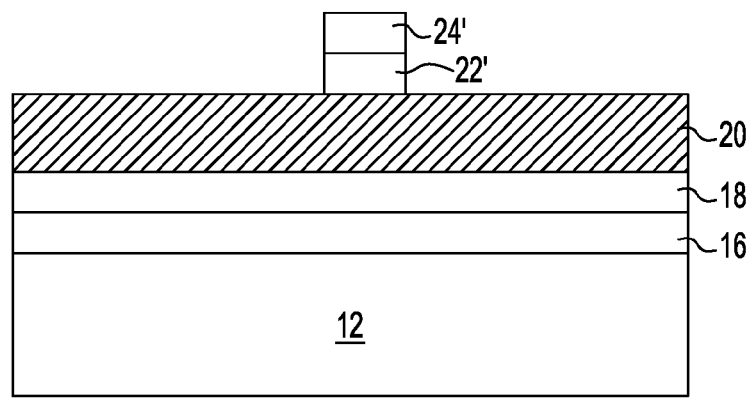
FIG. 5 is a pictorial representation (through a cross sectional view) of the structure of FIG. 4 after patterning the blanket layer of first hard mask material using the remaining portion of the blanket layer of second hard mask material as a second etch mask.

Referring now to FIG. 5, there is illustrated the structure of FIG. 4 after patterning the blanket layer of first hard mask material 22 using the remaining portion of the blanket layer of second hard mask material 24' as a second etch mask. The remaining portion of the blanket layer of first hard mask material which is not removed during this step of the present disclosure is designated in the drawings as element 22'. The patterning of the blanket layer of first hard mask material 22 can include a dry etching process such as, for example, reactive ion etching, plasma etching, or ion beam etching. As shown, the remaining portion of the blanket layer of first hard mask material 22' has sidewalls that are vertically coincident to that of the remaining portion of the blanket layer of second hard mask material 24'.

Figure 6:
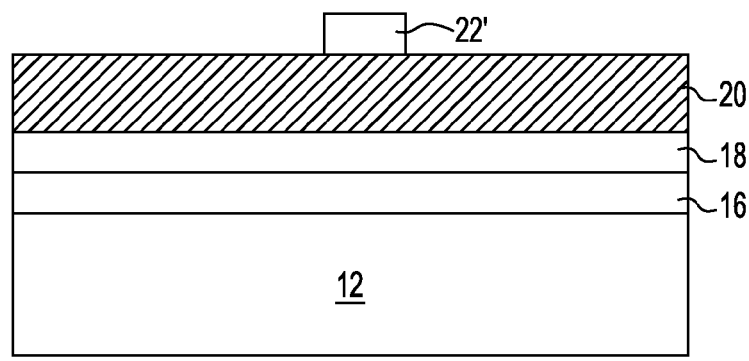
FIG. 6 is a pictorial representation (through a cross sectional view) of the structure of FIG. 5 after removing the remaining portion of the blanket layer of second hard mask material from the structure.

Referring now to FIG. 6, there is illustrated the structure of FIG. 5 after removing the remaining portion of the blanket layer of second hard mask material 24' from the structure leaving the remaining portion of the first hard mask material 22' atop the blanket layer of metal or metal alloy 20. In one embodiment, the removal of the remaining portion of the blanket layer of second hard mask material 24' from the structure can include a planarization process such as, for example, chemical mechanical polishing and/or grinding. In another embodiment, a wet etch can be used to remove the remaining portion of the blanket layer of second hard mask material 24' from the structure. An example of a wet etch process that can be used in the present disclosure to remove the remaining portion of the blanket layer of second hard mask material 24' includes a diluted HF solution.

Figure 7:
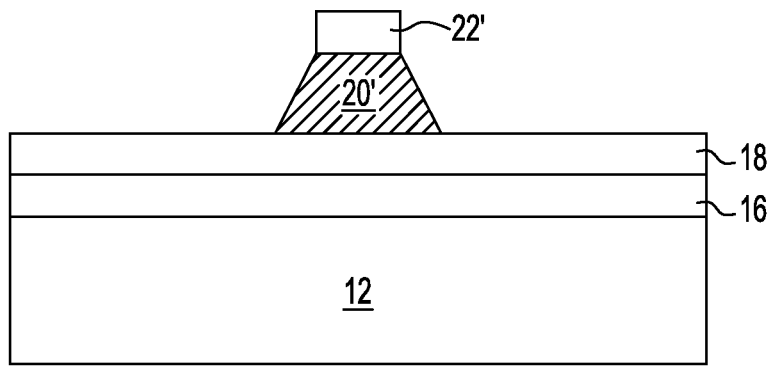
FIG. 7 is a pictorial representation (through a cross sectional view) of the structure of FIG. 6 after patterning the blanket layer of metal or metal alloy using the remaining portion of the blanket layer of first hard mask material as a third etch mask.

Referring now to FIG. 7, there is illustrated the structure of FIG. 6 after patterning the blanket layer of metal or metal alloy 20 using the remaining portion of the blanket layer of first hard mask material 22' as a third etch mask. In accordance with the present disclosure the exposed portions of the blanket layer of metal or metal alloy 20 that are not protected by the remaining portion of the first hard mask material 22' can be removed utilizing a plasma etching process in which a plasma that is capable of forming a polymeric compound and/or complex on remaining, e.g., non-etched, portions of the blanket layer of metal or metal alloy is used as a metal or metal alloy etchant. In one embodiment, the plasma etch can be performed at nominal room temperature. By "nominal room temperature" it is meant a temperature from 15° C. to 80° C. The plasma etch that can be employed in the present disclosure is also performed at a pressure of less than 100 mTorr. Pressures above 100 mTorr are undesirable since it may result in an excess build up of a polymeric compound and/or complex on the unetched portion of the blanket layer of metal or metal alloy 20 which if too thick is difficult to remove. In one embodiment, the plasma etch is performed at a pressure from 1 mTorr to 50 mTorr.

In one embodiment, the plasma etch that can be employed during the plasma etch of the present disclosure can be generated from a hydrocarbon-containing precursor which may or may not include oxygen. Thus, oxygen is an optional component. In one embodiment, the plasma etch can be performed by using a mixture of a hydrocarbon-containing precursor and oxygen. In such instances, a single etch step can be employed. In another embodiment, the plasma etch can be performed utilizing alternating pulses of a hydrocarbon-containing precursor and oxygen. In such instances, at least two etch steps can be employed. Typically, the last pulse of any sequence of pulses includes oxygen. In embodiments in which a hydrocarbon plasma is used, a polymeric hydrocarbon containing compound and/or complex can form on non-etched portions of the blanket layer of metal or metal alloy 20. In embodiments in which a hydrocarbon and oxygen plasma is used, a polymeric compound and/or complex containing C, H and O can form on non-etched portions of the blanket layer of metal or metal alloy 20.

When a hydrocarbon-containing precursor is employed, the hydrocarbon-containing precursor that can be employed in the present disclosure is an organic compound that consists entirely of hydrogen and carbon. The hydrocarbon-containing precursor that can be employed in the present disclosure can be an alkane (i.e., a compound having the formula $C_nH_{2n+2}$ wherein n is from 1 to 20 carbon atoms), an alkene (i.e., a compound having the formula $C_nH_{2n}$ wherein n is from 2 to 20 carbon atoms), an alkyne (i.e., a compound having the formula $C_nH_{2n-2}$ wherein n is from n is from 2 to 20 carbon atoms), a cycloalkane (i.e., a compound containing one or more carbon rings to which hydrogen atoms are attached and generally having the formula $C_nH_{2n}$ wherein n is from 3 to 12 carbon atoms), and/or an arene (i.e., a compound having one or more aromatic ring). In one embodiment, the hydrocarbon-containing precursor that can be employed in the present disclosure includes an alkene having from 2 to 12 carbon atoms. In one example, the alkene is ethylene.

In one embodiment of the present disclosure, the ratio of hydrocarbon-containing precursor to oxygen that is used during the plasma etch is from 1:0 to 1:10; at 0 no oxygen is present. In another embodiment of the present disclosure, the ratio of hydrocarbon-containing precursor to oxygen that is used during the plasma etch is from 10:1 to 1:10.

In another embodiment, the plasma that can be used during the plasma etch of the present disclosure can be generated by using CO and optionally hydrogen. In one embodiment, the CO and hydrogen can be used as a mixture. In such instances, the plasma etch can be performed in a single step. In another embodiment, the CO and hydrogen can be added it separate pulses. In such instances, the plasma etch can be performed in at least to two steps. Typically, the last pulse of any sequence of pulses includes CO. In embodiments in which a CO plasma is used, a polymeric compound and/or complex containing C and O can form on non-etched portions of the blanket layer of metal or metal alloy 20. In embodiments in which a CO and hydrogen plasma is used, a polymeric compound and/or complex containing C, O and H can form on non-etched portions of the blanket layer of metal or metal alloy 20.

In one embodiment of the present disclosure, the ratio of CO to hydrogen that is used during the plasma etch is from 10:0 to 1:10; at 0 no hydrogen is present. In another embodiment of the present disclosure, the ratio of CO to hydrogen that is used during the plasma etch is from 10:0 to 1:10.

In a further embodiment, the plasma that can be employed during the plasma etch of the present disclosure can be generated by using $CO_2$ and optionally hydrogen. In one embodiment, the $CO_2$ and hydrogen can be used as a mixture. In such instances, the plasma etch can be performed in a single step. In another embodiment, the $CO_2$ and hydrogen can be added it separate pulses. In such instances, the plasma etch can be performed in at least to two steps. Typically, the last pulse of any sequence of pulses includes $CO_2$. In embodiments in which a $CO_2$ plasma is used, a polymeric compound and/or complex containing C and O can form on non-etched portions of the blanket layer of metal or metal alloy 20. In embodiments in which a $CO_2$ and hydrogen plasma is used, a polymeric compound and/or complex containing C, O and H can form on non-etched portions of the blanket layer of metal or metal alloy 20.

In one embodiment of the present disclosure, the ratio of $CO_2$ to hydrogen that is used during the plasma etch is from 10:0 to 1:10; at 0 no hydrogen is employed. In another embodiment of the present disclosure, the ratio of $CO_2$ to hydrogen that is used during the plasma etch is from 10:1 to 1:10.

During the plasma etching of the blanket layer of metal or metal alloy 20, the plasma generates a polymeric compound and/or complex which builds up on the sidewalls of the portion of the blanket layer of metal or metal alloy 20 that are located directly beneath the remaining portion of the blanket layer of first hard mask material 22'. The built up polymeric compound and/or complex protects the sidewalls of the portion of the blanket layer of metal or metal alloy 20 that are located directly beneath the remaining portion of the blanket layer of first hard mask material 22' from being damaged during the plasma etch. The built up polymeric compound and/or complex can be removed during the plasma etching process by providing excessive oxygen species with the same. In one embodiment, the polymeric compound and/or complex can consist of C and H. In another embodiment, the polymeric compound and/or complex can consist of C and O. In another embodiment, the polymeric compound and/or complex can consist of C, H and O.

In the embodiment illustrated, the blanker layer of metal or metal alloy 20 is etched down to the uppermost surface of the blanket layer of diffusion barrier material 18, except for portions that are located directly beneath the remaining portion of the first hard mask material 22'. The remaining portion of the blanket layer of metal or metal alloy (designated as element 20' in the drawings) forms a conductive feature, i.e., conductive line or conductive via. In one embodiment (not shown, but which can be readily deduced from the drawings of the present application), the remaining portion of the blanket layer of metal or metal alloy 20' has sidewalls that are vertically coincident to sidewalls of the remaining portion of the first hard mask material 22'. In another embodiment of the present disclosure, and as shown in the drawings, the remaining portion of the metal or metal alloy 20' has a substantially pyramidal profile having, for example, a sidewall taper of approximately from 85 to 99 degrees. In the specific embodiment illustrated, the height of remaining portion of the metal or metal alloy 20' is greater than the widest portion of the remaining portion of the metal or metal alloy 20', i.e., the base of the remaining of the remaining portion of metal or metal alloy 20'. In one embodiment, the height of remaining portion of the metal or metal alloy 20' is at least 20% greater than the widest portion of the remaining portion of the metal or metal alloy 20'.

Figure 8:
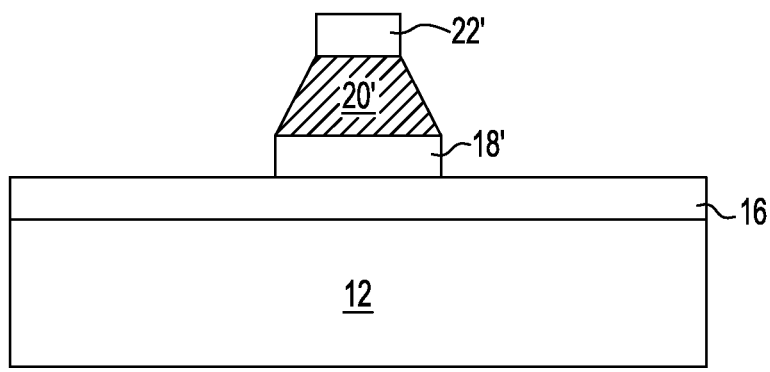
FIG. 8 is a pictorial representation (through a cross sectional view) of the structure of FIG. 7 after etching the blanket layer of diffusion barrier material using the remaining portion of the blanket layer of first hard mask material and the remaining portion of the blanket layer of metal or metal alloy as a fourth etch mask.

Referring now to FIG. 8, there is illustrated the structure of FIG. 7 after etching the blanket layer of diffusion barrier material 18 using the remaining portion of the blanket layer of first hard mask material 22' and the remaining portion of the blanket layer of metal or metal alloy 20' as a fourth etch mask. The remaining portion of the blanket layer of diffusion barrier material which is designated as element 18' in the drawings lies beneath the remaining portion of the metal or metal alloy 20' and forms the base of the "trenches" that immediately surround the remaining portion of the metal or metal alloy 20'. The etch used to remove the portions of the blanket layer of diffusion barrier material 18 that are not protected by the remaining portion of the metal or metal alloy 20' comprises an anisotropic etch.

Figure 9:
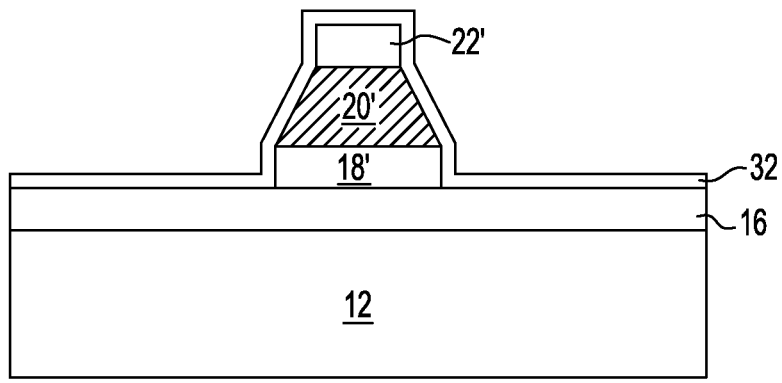
FIG. 9 is a pictorial representation (through a cross sectional view) of the structure of FIG. 8 after forming a diffusion barrier liner material on all exposed surfaces of the structure shown in FIG. 8.

Referring now to FIG. 9, there is illustrated the structure of FIG. 8 after forming a diffusion barrier liner material 32 on all exposed surfaces of the structure shown in FIG. 8. The diffusion barrier liner material 32 can include any material that can serve as a barrier to prevent conductive metal ions from diffusing into an interconnect dielectric material to be subsequently formed. Examples of materials that can be used as diffusion barrier liner material 32 include, for example, cobalt (Co), iridium (Ir), platinum (Pt), palladium (Pd), tantalum (Ta), tantalum nitride (TaN), titanium (Ti), titanium nitride (TiN), manganese (Mn), manganese oxide ($MnO_x$), ruthenium (Ru), ruthenium nitride (RuN), a ruthenium-tantalum alloy (RuTa), ruthenium-tantalum nitride (RuTaN), tungsten (W), tungsten nitride (WN) or any multilayered stack thereof.

In one embodiment, the diffusion barrier liner material 32 may comprise a same diffusion barrier material as the blanket layer of diffusion barrier material 18. In another embodiment, the diffusion barrier liner material 32 may comprise a different diffusion barrier material as the blanket layer of diffusion barrier material 18.

The diffusion barrier liner material 32 can be formed by a deposition process including, for example, chemical vapor deposition (CVD), plasma enhanced chemical vapor deposition (PECVD), atomic layer deposition (ALD, physical vapor deposition (PVD), sputtering and plating. The thickness of the diffusion barrier liner material 32 may vary depending on the deposition process used as well as the material employed. In one embodiment, the diffusion barrier liner material 32 can have a thickness from 4 nm to 40 nm. Other thicknesses that are greater or lesser than the range provided above can also be used for the diffusion barrier liner material 32.

Figure 10:
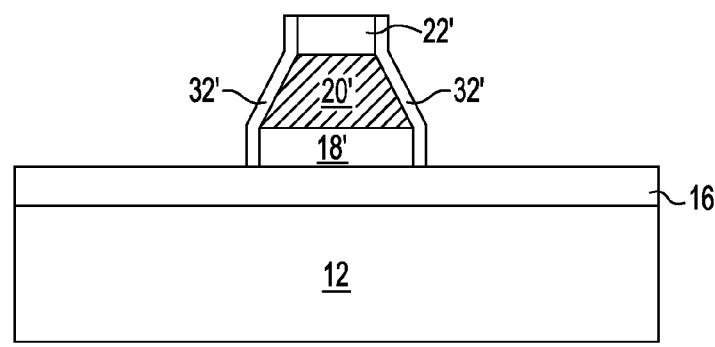
FIG. 10 is a pictorial representation (through a cross sectional view) of the structure of FIG. 9 after removing all horizontal portions of the diffusion barrier liner material from the structure.

Referring now to FIG. 10, there is illustrated the structure of FIG. 9 after removing all horizontal portions of the diffusion barrier liner material 32 from the structure. The remaining diffusion barrier liner material, which is present on the sidewalls of the remaining portion of the blanket layer of metal or metal alloy 20' and the sidewalls of the remaining portion of the blanket layer of diffusion barrier material 18, can be referred to herein as a diffusion barrier liner 32'. The horizontal portions of the diffusion barrier liner material 32 can be removed utilizing a directional etching process such as, for example, a reactive ion etching process.

Figure 11:
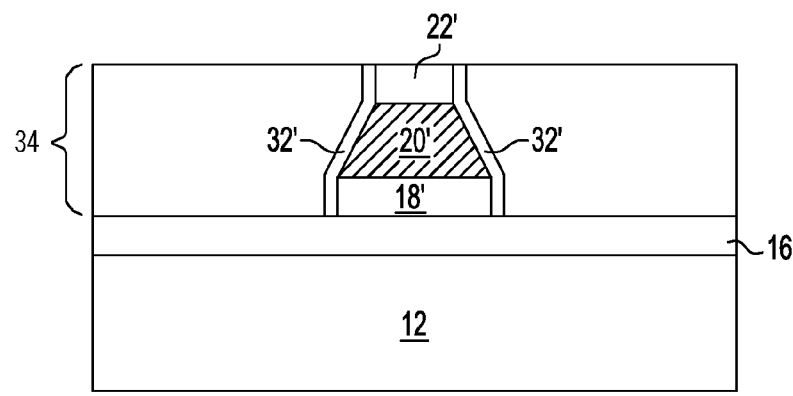
FIG. 11 is a pictorial representation (through a cross sectional view) of the structure of FIG. 10 after forming an interconnect dielectric material and performing a planarization process.

Referring now to FIG. 11, there is illustrated the structure of FIG. 10 after forming an interconnect dielectric material 34 and performing a planarization process. The planarization process results in a structure in which the interconnect dielectric material 34 has an uppermost surface that is coplanar with the uppermost surface of the remaining portion of the blanket layer of first hard mask material 22'. In the structure, the remaining portion of the blanket layer of first hard mask material 22' can serve as a metal cap for the remaining portion of the blanket layer of metal or metal alloy 20'. The remaining portion of portion of the blanket layer of metal or metal alloy 20' represents the conductive feature of an interconnect structure and is embedded with the interconnect dielectric material 34. Sidewall surfaces of the remaining portion of the blanket layer of metal or metal alloy 20' are separated from the interconnect dielectric 34 by diffusion barrier liner 32'.

The interconnect dielectric material 34 that can be employed in the present disclosure may include any interlevel or intralevel dielectric material including inorganic dielectrics or organic dielectrics. The interconnect dielectric material 34 may be porous, non-porous or contain regions and/or surfaces that are porous and other regions and/or surfaces that may be non-porous. Some examples of suitable dielectrics that can be used as the interconnect dielectric material 34 include, but are not limited to, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the interconnect dielectric material 34 has a dielectric constant that is less than silicon dioxide, i.e., less than 4.0. In another embodiment, the interconnect dielectric material 34 that can be employed in the present disclosure has a dielectric constant of 3.0 or less. All dielectric constants mentioned herein are relative to a vacuum, unless otherwise noted. Dielectrics which have a dielectric constant of less than that of silicon dioxide generally have a lower parasitic cross talk as compared with dielectric materials that have a higher dielectric constant equal to, or greater than, silicon dioxide. Generally, silicon dioxide has a dielectric constant of 4.0.

The thickness of the interconnect dielectric material 34 may vary depending upon the composition of the dielectric material used as well as the exact number of dielectric layers within the interconnect dielectric material 34. In one embodiment, the interconnect dielectric material 34 can have a thickness from 50 nm to 1000 nm. In other embodiments, the interconnect dielectric material 34 can have a thickness that is greater than or less than the thickness range mentioned above. The interconnect dielectric material 34 can be formed utilizing a deposition process such as, for example, chemical vapor deposition (CVD), plasma enhanced chemical vapor deposition (PECVD), evaporation, chemical solution deposition and spin-on coating.

In some embodiments, the planarization process that can be employed in the present disclosure in forming the structure shown in FIG. 11 includes chemical mechanical polishing and/or grinding. In other embodiments, an etch back process can be used to provide the planar structure shown in FIG. 11.

The method of the present disclosure, as described above, enables the fabrication of semiconductor structures, i.e., interconnect structures, having small feature sizes (i.e., line widths with less than 40 nm and/or pitches of less than 100 nm. The resultant semiconductor structures are fabricated with minimal damage to the interconnect dielectric material 34 and trenches, which are substantially free of voids and defects. The method of the present disclosure also results in maximized grain growth and minimized resistivity in the semiconductor structures of the present disclosure. Furthermore, the use of the plasma etch process described above in etching exposed portions of the blanket layer of metal or metal alloy 20 minimizes the surface roughening effect of the surface of the remaining portion of the blanket layer of metal or metal alloy 20' as compared to conventional damascene processes thereby better maintaining the conductivity of the remaining portion of the blanket layer of metal or metal alloy 20' which serves as a conductive feature in the disclosed structures.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming at least one metal or metal alloy feature in an integrated circuit, said method comprising:
providing a material stack including at least an etch mask located on a blanket layer of metal or metal alloy; and
removing exposed portions of the blanket layer of metal or metal alloy that are not protected by said etch mask utilizing an etch comprising a plasma, wherein said plasma comprises a hydrocarbon-containing precursor, CO or $CO_2$ and forms a polymeric compound and/or complex which protects a portion of the blanket layer of metal or metal alloy located directly beneath the etch mask during said etch.

2. The method of claim 1, wherein said plasma comprises said hydrocarbon-containing precursor and oxygen.

3. The method of claim 2, wherein said plasma comprises a ratio of said hydrocarbon-containing precursor to oxygen of from 1:0 to 1:10.

4. The method of claim 2, wherein said hydrocarbon-containing precursor comprises an alkene containing from 1 to 20 carbon atoms.

5. The method of claim 4, wherein said alkene is ethylene.

6. The method of claim 1, wherein said plasma comprises CO and hydrogen.

7. The method of claim 6, wherein said plasma comprises a ratio of CO to hydrogen of from 1:0 to 1:10.

8. The method of claim 1, wherein said plasma comprises $CO_2$ and hydrogen.

9. The method of claim 8, wherein said plasma comprises a ratio of $CO_2$ to hydrogen of from 1:0 to 1:10.

10. The method of claim 1, wherein said etch is performed at a temperature from 15° C. to 80° C. and at a pressure of less than 100 mTorr.

11. The method of claim 1, wherein said etch mask comprises a metal mask material, and said metal mask material is selected from Ta, TaN, Ti, TiN, W, WN, Nb, V and a multi-layered stack thereof.

12. The method of claim 1, wherein said blanket layer of metal or metal alloy is located on surface of a blanket layer of a diffusion barrier material.

13. The method of claim 12, further comprising removing exposed portions of the blanket layer of diffusion barrier material not protected by said etch mask and said portion of the blanket layer of metal or metal alloy.

14. The method of claim 13, further comprising forming a diffusion barrier liner on exposed sidewall surfaces of said portion of the blanket layer of metal or metal alloy.

15. The method of claim 14, further comprising forming an interconnect dielectric material adjacent said portion of the blanket layer of metal or metal alloy protected by said etch mask, wherein an uppermost surface of said etch mask is coplanar with an uppermost surface of the interconnect dielectric material.

16. A method of forming at least one metal or metal alloy feature in an integrated circuit, said method comprising:
providing a material stack on a surface of a substrate, wherein said material stack comprises, from bottom to top, a blanket layer of dielectric material, a blanket layer of metal or metal alloy, a blanket layer of a first hard mask material, and a blanket layer of a second hard mask material;
forming a patterned mask on an uppermost surface of said material stack;
first transferring a pattern from said patterned mask into the blanket layer of a second hard mask material, wherein after said first transferring of the pattern said patterned mask is removed;
second transferring said pattern from a remaining portion of said blanket layer of second hard mask material into said blanket layer of first hard mask material, wherein after said second transferring of the pattern said remaining portion of the blanket layer of second hard mask material is removed; and
removing exposed portions of the blanket layer of metal or metal alloy that are not protected by a remaining portion of said blanket layer of first hard mask material utilizing an etch comprising a plasma, wherein said plasma forms a polymeric compound and/or complex which protects a portion of the blanket layer of metal or metal alloy located directly beneath the remaining portion of said blanket layer of first hard mask material during said etch.

17. The method of claim 16, wherein said material stack further comprises a blanket layer of a diffusion barrier material located between said blanket layer of dielectric material and said blanket layer of metal or metal alloy.

18. The method of claim 16, wherein said plasma comprises a hydrocarbon-containing precursor and optionally oxygen.

19. The method of claim 18, wherein said hydrocarbon-containing precursor is ethylene.

20. The method of claim 16, wherein said plasma comprises CO, CO and hydrogen, $CO_2$ or $CO_2$ and hydrogen.

21. The method of claim 16, wherein said etch is performed at a temperature from 15° C. to 80° C. and at a pressure of less than 100 mTorr.

22. The method of claim 17, further comprising removing exposed portions of the blanket layer of diffusion barrier material not protected by said remaining portion of said first hard mask material and said remaining portion of the blanket layer of metal or metal alloy.

23. The method of claim 22, further comprising forming a diffusion barrier liner on exposed sidewall surfaces of said remaining portion of the blanket layer of metal or metal alloy.

24. The method of claim 23, further comprising forming an interconnect dielectric material adjacent said remaining portion of the blanket layer of metal or metal alloy protected by said remaining portion of the blanket layer of first hard mask material, wherein an uppermost surface of said remaining portion of the blanket layer of first hard mask material is coplanar with an uppermost surface of the interconnect dielectric material.

* * * * *